United States Patent [19]
Madsen et al.

[11] Patent Number: 5,381,291
[45] Date of Patent: Jan. 10, 1995

[54] VERTICAL CONTACT - CANTED MAGNET MAGNETORESISTIVE SENSOR

[75] Inventors: Timothy A. Madsen, Bloomington; Daniel J. O'Connor, Prior Lake, both of Minn.

[73] Assignee: Seagate Technology, Inc., Scotts Valley, Calif.

[21] Appl. No.: 202,052

[22] Filed: Feb. 25, 1994

[51] Int. Cl.⁶ .............................................. G11B 5/127
[52] U.S. Cl. ................................................. 360/113
[58] Field of Search ........................ 360/113, 126, 103

[56] References Cited

U.S. PATENT DOCUMENTS

| | | | |
|---|---|---|---|
| 3,840,898 | 10/1974 | Bajorek | 360/113 |
| 4,956,736 | 9/1990 | Smith | 360/113 |
| 5,079,035 | 1/1992 | Krounbi et al. | 427/130 |

*Primary Examiner*—A. J. Heinz
*Attorney, Agent, or Firm*—Kinney & Lange

[57] ABSTRACT

A magnetoresistive sensor has an air bearing surface, first and second vertical contacts having contact edges generally perpendicular to the air bearing surface, a generally rectangular magnetoresistive region having a first edge that comprises part of the air bearing surface and a plurality of additional edges which do not comprise part of the air bearing surface, and a permanent magnet layer having a magnetization vector oriented at 45° with respect to the air bearing surface, wherein the plurality of additional edges are generally within the permanent magnet layer. The magnetoresistive sensor provides a relatively square read sensitivity window because the sense current is maintained parallel to the air bearing surface throughout the magnetoresistive region. In addition, the sensor is lapping intolerant because the relative positions of the first and second vertical contacts and the magnetoresistive region do not change as the air bearing surface is lapped.

7 Claims, 4 Drawing Sheets

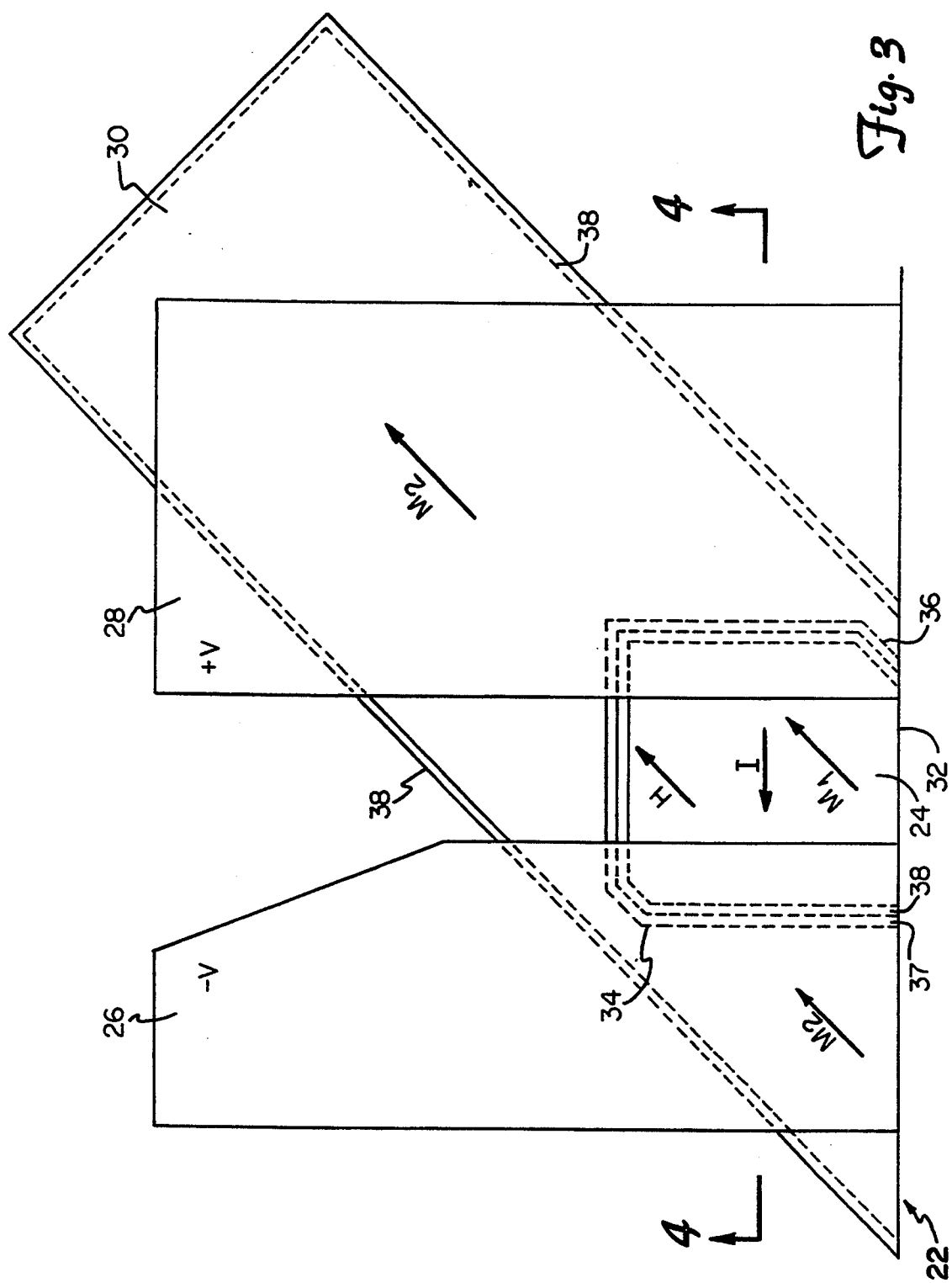

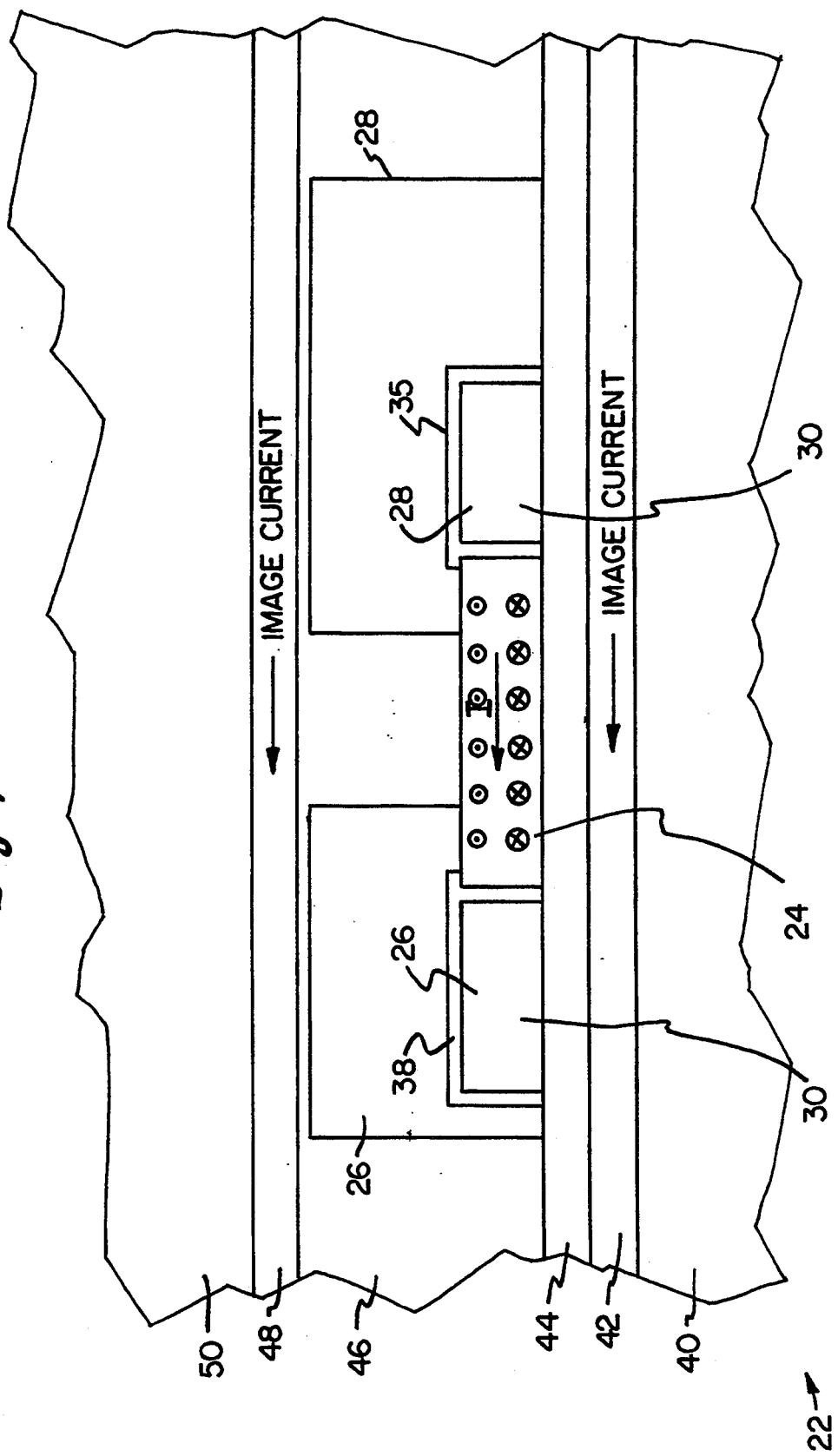

VERTICAL CONTACT - CANTED MAGNET MAGNETORESISTIVE SENSOR

BACKGROUND OF THE INVENTION

The present invention is a magnetoresistive (MR) sensor. More specifically, the present invention is an MR sensor having a permanent magnet stabilization layer with a magnetization vector at 45° with respect to an air bearing surface of the sensor, and vertical current contacts MR sensors are used to detect magnetic flux levels stored on magnetic media. In an MR sensor, the resistance of the sensor varies with the magnitude of the flux passing through the sensor. Typically, a constant current is passed through the sensor and the magnitude of the flux passing through the sensor is represented by a change in the voltage across the sensor, which of course is a function of the resistance of the sensor Likewise, a constant voltage source can be applied to the MR sensor, in which case the magnetic flux magnitude is represented by a change in the current through the sensor.

In an MR sensor, maximum sensitivity is achieved when a static magnetization vector is applied at 45° with respect to the direction of current flow through the MR sensor. This relationship exists because the output voltage of the MR sensor for any given input current is proportional to $COS^{2\theta}$, where $\theta$ is the angle between the static magnetization vector and the current vector. At 45°, this function provides maximum equal and opposite changes in output for corresponding equal and opposite deviations in magnetic flux.

In one typical configuration, referred to as the canted current configuration, the magnetization vector lies along a line between the first and second contacts such that the current flows through the magnetoresistive material at 45° with respect to the line. To achieve this, the contacts are canted, or slanted, across the magnetoresistive material at a 45° angle with respect to the line. In addition, the resistance of the contacts is significantly less than the resistance of the magnetoresistive material.

In the canted current configuration, the current flows out of the first canted contact perpendicular to the boundary between the first contact and the magnetoresistive layer. The current then flows across the magnetoresistive layer at the desired 45° angle and encounters the second contact perpendicular to the boundary between the second contact and the magnetoresistive layer, which again is 45° with respect to the line connecting the first and second contacts. To enhance the stability of the device, permanent magnet material may be positioned proximate the contacts such that the permanent magnet material provides a magnetic field H in the magnetoresistive layer along a line between the contacts. In addition, if Permalloy is formed into a long narrow strip, the magnetization vector M of the Permalloy will naturally point along the long axis of the strip.

One limitation of the canted current configuration is that the width of the detection region of the sensor is limited by the height of the sensor. For example, assume that the current is flowing in a sensor from right to left, and the right contact is canted at 45°, with the lower portion of the right contact more to the left than the upper portion. In this configuration, the current will tend to flow from the bottom of the magnetoresistive material to the top of the material. Accordingly, at 45° the maximum width of the detection region equals $\sqrt{2}$ times the magnetoresistive layer height.

Another problem associated with canted contact MR sensors is that the read sensitivity window shifts with respect to the integral write gap of the write element as the air bearing surface of the transducer is lapped. This makes it more difficult to control the read-to-write alignment of a transducer having a canted contact MR sensor and a separate write element.

SUMMARY OF THE INVENTION

The present invention is a magnetoresistive (MR) sensor having an air bearing surface (ABS), first and second vertical contacts having contact edges generally perpendicular to the ABS, a generally rectangular magnetoresistive region having a first edge that comprises part of the ABS and a plurality of additional edges which do not comprise part of the ABS, and a permanent magnet layer having a magnetization vector oriented at 45° with respect to the ABS, wherein the plurality of additional edges are generally within the permanent magnet layer.

The MR sensor of the present invention provides a relatively square read sensitivity window because the sense current is maintained parallel to the ABS. In addition, the read-to-write alignment of a transducer that includes the sensor the present invention and a write element is lapping intolerant because the relative positions of the first and second vertical contacts do not shift with respect to the write gap of the write element as the ABS is lapped.

BRIEF DESCRIPTION OF THE DRAWINGS

FIG. 3 shows the MR sensor of the present invention with an additional insulation layer.

FIG. 4 is a sectional view taken along line 4—4 of FIG. 3.

DETAILED DESCRIPTION OF THE PREFERRED EMBODIMENTS

Figure 1:
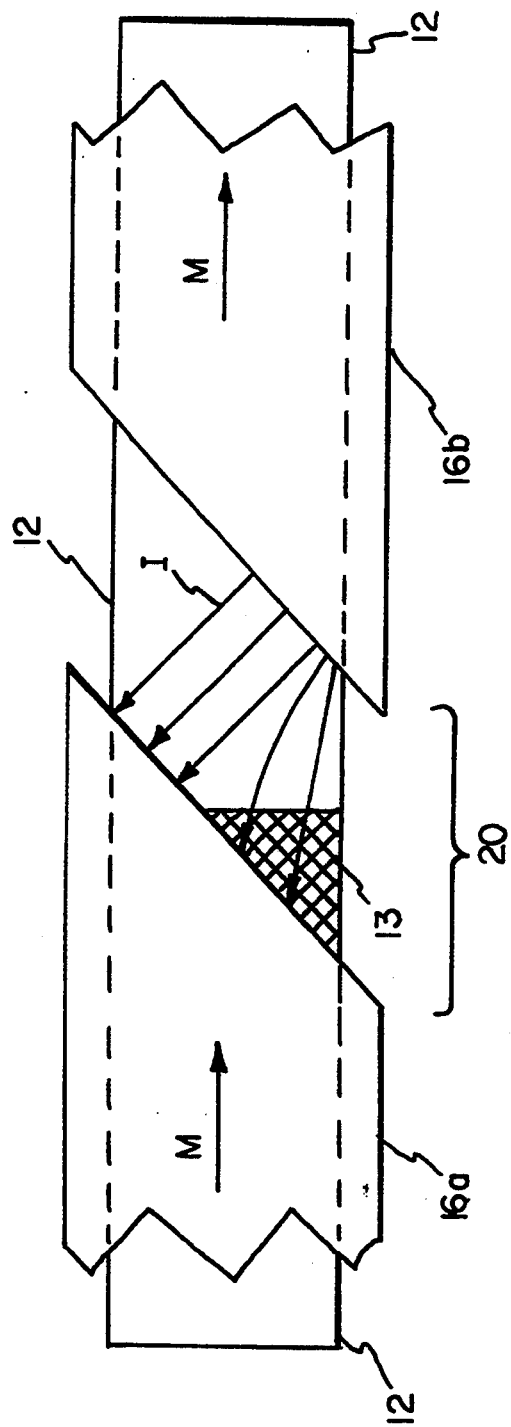
FIG. 1 shows a magnetoresistive (MR) sensor of the prior art.

FIG. 1 shows magnetoresistive (MR) sensor 10 of the prior art. Sensor 10 is comprised of a magnetoresistive region 12, which is formed of a strip of Permalloy, and contacts 16a and 16b.

In prior art sensor 10, a read current is applied to contact 16b. Since contact 16b has much lower resistance than sensor region 12, current will flow out of contact 16b perpendicular to the boundary between contact 16b and sensor region 12. Since contact 16b is canted at 45° with respect to the longitudinal axis of sensor 10, the current flows through sensor region 12 at 45° with respect to the longitudinal axis, as shown by the arrows I in region 12.

As the current flows through region 12, it flows from the bottom of region 12 toward the top of region 12 until it intersects contact 16a, which is also formed from a highly conductive material. The current then flows into a read amplifier.

To achieve maximum sensitivity in an MR sensor, the current must flow at 45° with respect to a static magnetic field. When Permalloy is formed into a long narrow strip, the magnetization vector M will naturally orient itself with the long axis of the strip. The magnetization vector M is at 45° with respect to the flow of current because the current flow is maintained at 45° by contacts 16a and 16b.

Sense region 20 represents the portion of sensor 10 which is used to detect magnetic flux levels stored on magnetic media. As magnetic media moves with respect to MR sensor 10, the flux transitions stored on the media will pass through sense region 20. As the flux entering region 20 varies, the resistance of magnetoresistive region 12 varies. If a constant current is passed through sensor 10, then the voltage present between contacts 16a and 16b will vary as a function of the magnetic flux passing through sense region 20. Likewise, if a constant voltage is applied to contact 16a and 16b, then the current flowing through sensor 10 will vary with the flux present at sense region 20.

One problem associated with prior art sensor 10 is that current does not tend to flow through triangular region 13 at 45° with respect to the magnetization vector M. The hypotenuse of triangle 13 provides a surface for receiving current, however there is no corresponding surface on contact 16b to send out the current at 45°. Accordingly, the current tends to flow into triangular region 13 at an angle less than 45° with respect to M, thereby affecting the read sensitivity of sensor 10.

As will become apparent below, this problem is solved by the present invention. In addition, this problem is addressed in U.S. patent application Ser. No. 07/936,185 to George et al. entitled "Improved Read Sensitivity MR Head Using Permanent Magnet Longitudinal Stabilization" and assigned to the same Assignee as the present application, which is incorporated herein by reference.

Another problem associated with prior art sensor 10 is that the sense region 20 will shift to the right as the air bearing surface (ABS) of a transducer comprising a sensor 10 and a write element is lapped. This complicates assembling such a transducer having a sensor such as that shown in FIG. 1 because the location of zone 20 will shift with respect to the write gap of the write element.

Figure 2:
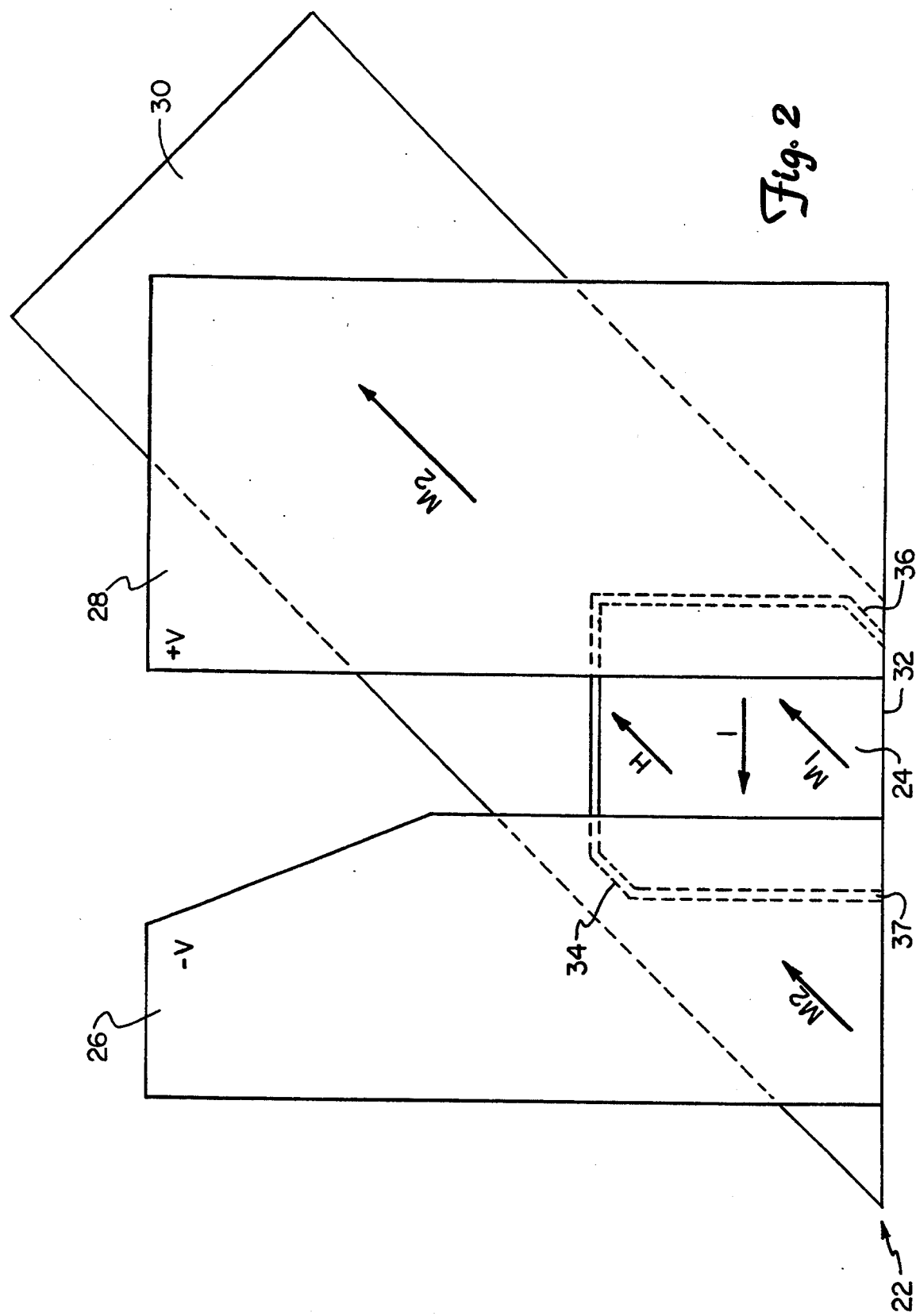
FIG. 2 shows the vertical contact canted permanent magnet MR sensor of the present invention.

FIG. 2 shows vertical contact permanent magnet MR sensor 22 of the present invention. Sensor 22 is comprised of MR region 24, vertical contacts 26 and 28, and permanent magnet layer 30. Sensor 22 has an air bearing surface (ABS) 32 that is positioned adjacent a magnetic media surface when sensor 22 is assembled in a disc drive.

When sensor 22 is assembled in a disc drive, a sense current I is applied to vertical contacts 26 and 28. Contacts 26 and 28 are electrically coupled to MR region 24, and sense current I flows through MR region 24 generally parallel to ABS 32.

As discussed above, an MR sensor achieves maximum sensitivity when the sense current is applied at 45° with respect to a magnetic field H. In sensor 22, MR region 24 has a magnetization vector $M_1$ directed at 45° with respect to ABS 32. This is achieved by using an oftenting magnetic field during deposition of the sensor, by the square shape of the sensor, which also includes clipped corners 34 and 36, and by the orienting magnetic field H produced by permanent magnet film 30, especially along the unexposed edges of the MR sensor, 24.

Layer 30 has a magnetization vector $M_2$ which helps to maintain MR region 24 in a single magnetic domain. In addition, if the magnetization of region 24 is disturbed by a strong external magnetic field, permanent magnet layer 30 will help to reset region 24 into a single magnetic domain.

To minimize magnetic moment discontinuities along the boundaries between permanent magnet layer 30 and MR region 24, edges 34 and 36 have been clipped to have boundaries that are generally parallel to the magnetization vector $M_2$ of layer 30. If edges 34 and 36 are not clipped, these edges would provide points where region 24 could begin to fracture into multiple domains. Once an MR region begins fracturing into multiple domains at a vulnerable point in the region, the fracturing may spread to other portions of the MR region.

When MR region 24 is formed, crystal anisotropy can be utilized by providing an oftenting field during MR film deposition to initially magnetize region 24 along magnetization vector $M_1$. Further, in addition to permanent magnet layer 30, a half-gap mismatch between upper and lower shields helps to maintain vector $M_1$ in an upward direction. The half-gap mismatch will be describe below with reference to FIG. 4.

While the embodiment of the present invention shown in FIG. 2 is provided with gap 37 between the permanent magnet layer and the MR region, this gap is not necessary if the permanent magnet layer's resistivity is chosen such that it is much higher than that of the MR layer. Such a configuration is disclosed in U.S. Pat. No. 5,079,035, which is hereby incorporated by reference.

In the preferred embodiment of the present invention, the MR region is preferably composed of an alloy comprised of $Ni_{82}Fe_{18}$. This alloy is also referred to as Permalloy. The permanent magnet layers are preferably formed of one of the following (or similar) alloys: $CO_{78}Pt_{22}$, $CO_{78}Cr_8Pt_{14}$, and $CO_{80}Sm_{20}$. The conductive contacts are preferably composed of a trilayer of Mo-Au-Mo, but many other conducting materials may be used.

It is theorized that the proper thickness of permanent magnet layer is the thickness sufficient to produce the same magnetic flux as that present at the boundary of a saturated MR layer. Exceeding this amount of flux, while serving to keep the MR element in a single domain state, tends to decrease the sensitivity of the MR element to flux from the magnetic media.

Because the adjacent edges of the MR region and the permanent magnet layers are the same length, the magnetic flux will be matched if:

$$M_2*t(PM)=M_1*t(MR),$$

where $M_1$ is the rest state magnetization of MR region 24, $M_2$ is the rest state magnetization of permanent magnet layer 30, t(PM) represents the thickness of permanent magnet layer 30, and t(MR) represents the thickness of MR region 24. Because the value of $M_2$ of the preferred permanent magnet materials is approximately equal to the value of $M_1$ of the preferred magnetoresistive material, the thickness of the two layers should be approximately equal. Conventionally, this thickness will be on the order of 300 Angstroms. As is well known in the art, the conductive contacts can be made much thicker, and are typically in the order of 1000 angstroms thick.

FIG. 3 shows the MR sensor 22 of the present invention with the addition of insulator layer 38. Insulator layer 38 electrically isolates vertical current contacts 26 and 28 from permanent magnet layer 30, but does not interfere with the magnetic flux produced by permanent magnet layer 30 to hold MR region 24 in a single domain state. By using insulator layer 38, all sense current is substantially confined to MR region 24. Insulator layer 38 is formed from an oxide, such as $Al_2O_3$.

FIG. 4 is taken along line 4—4 in FIG. 3. In addition to the elements shown in FIG. 3, FIG. 4 shows base coat 40, lower soft magnetic shield 42, lower half-gap oxide layer 44, upper half-gap oxide layer 46, upper soft magnetic shield 48, and overcoat 50. Proximate MR region 24, lower half-gap oxide layer 44 is much thinner than upper half-gap oxide layer 46, resulting in a half-gap mismatch. Accordingly, the magnetic flux produced by lower shield 42 in reaction to sense current I is greater than the corresponding opposing flux from upper shield 48, which produces a net magnetic field in MR region 24 in the "up" direction with respect to ABS 32 in FIGS. 2 and 3. The net magnetic field produced by sense current I helps to keep MR region 24 magnetized at 45° with respect to ABS 32.

The George et al. application discloses a method suitable for fabricating the MR sensor of the present invention. In addition, U.S. patent application Ser. No. 08/148,890 entitled "Barberpole MR Sensor Having Interleaved Permanent Magnet and Magnetoresistive Segments" to Peter I. Bonyhard, which is assigned to the same assignee as the present application and is hereby incorporated by reference, also discloses a method suitable for fabricating the MR sensor of the present application.

The sensor of the present invention can be used in a variety of devices where it is desirable to detect changes in magnetic flux levels. It is envisioned that the present invention will primarily be utilized in disc drive systems. U.S. patent application Ser. No. 08/188,196 entitled "A Method of Measuring the Read-To-Write Offset In A Disc Drive Having Separate Read And Write Elements to Hieu V. Nguyen, which is assigned to the same assignee as the present application, discloses the orientation of an MR sensor within a disc drive system. This application is hereby incorporated by reference.

The present invention provides an MR sensor suitable for reading a signal recorded on a magnetic media. The sensor directs a sense current parallel to the ABS within an MR region that has a magnetization vector directed at 45° to the ABS. Since the sense current flows parallel to the ABS throughout the MR region, the read sensitivity window is relatively square and flat. The sensor is also provided with a stabilizing permanent magnet layer that helps maintain the magnetization vector of the MR region, and resets the MR region into a single magnetic domain if the MR region is disturbed by an external magnetic field.

The sense current is supplied to the MR region by a pair of vertical contacts, which have contact edges that are generally perpendicular to the ABS. Since the contacts are perpendicular to the ABS, the position of the read sensitivity window does not shift with respect to the ABS as the ABS is lapped.

Although the present invention has been described with reference to preferred embodiments, workers skilled in the art will recognize that changes may be made in form and detail without departing from then spirit and scope of the invention.

What is claimed is:

1. A magnetoresistive sensor comprising:
   an air bearing surface;
   a generally rectangular magnetoresistive region having a first edge that is parallel to the air bearing surface and a plurality of additional edges that are not parallel to the air bearing surface;
   first and second current contacts electrically coupled to the magnetoresistive region and having contact edges generally perpendicular to the air bearing surface; and
   a permanent magnet layer having a magnetization vector directed at approximately 45° to the air bearing surface, wherein the plurality of additional edges are generally within the permanent magnet layer.

2. The sensor of claim 1 wherein the magnetoresistive region has at least one corner that has a truncated edge which is parallel with the magnetization vector.

3. The sensor of claim 1 wherein the permanent magnet layer is formed from a material having a higher resistivity than the material from which the magnetoresistive region is formed.

4. The sensor of claim 1 wherein at least one gap separates the permanent magnet layer from the magnetoresistive region.

5. The sensor of claim 1 wherein the permanent magnet layer is separated adjacent from the magnetoresistive region and the first and second current contacts by electrical insulation.

6. The sensor of claim 1 and further comprising:
   a first half-gap oxide layer adjacent a first side of the magnetoresistive region;
   a second half-gap oxide layer adjacent a second side of the magnetoresistive region;
   a first magnetic shield adjacent the first half-gap oxide layer; and
   a second magnetic shield adjacent the second half-gap oxide layer, wherein the first half-gap oxide layer is thicker than the second half-gap oxide layer to produce a net magnetic field in the magnetoresistive region perpendicular to the air bearing surface.

7. The sensor of claim 1 wherein the first edge comprises part of the air bearing surface.

* * * * *

UNITED STATES PATENT AND TRADEMARK OFFICE
CERTIFICATE OF CORRECTION

PATENT NO. : 5,381,291
DATED : January 10, 1995
INVENTOR(S) : TIMOTHY A. MADSEN, DANIEL J. O'CONNOR It is certified that error appears in the above-indentified patent and that said Letters Patent is hereby corrected as shown below:

Col. 1, line 19, after "sensor", insert a --.--

Col. 3, line 58, delete "oftenting", insert --orienting--

Col. 4, line 14, delete "oftenting", insert --orienting--

Signed and Sealed this

Twenty-eight Day of March, 1995

Attest:

BRUCE LEHMAN

Attesting Officer          Commissioner of Patents and Trademarks